(12) United States Patent
Balestriero et al.

(10) Patent No.: US 6,561,690 B2
(45) Date of Patent: May 13, 2003

(54) LUMINAIRE BASED ON THE LIGHT EMISSION OF LIGHT-EMITTING DIODES

(75) Inventors: Christophe Balestriero, Caluire (FR); Marc Olivier Flaissier, Lyon (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/933,557

(22) Filed: Aug. 20, 2001

(65) Prior Publication Data
US 2002/0044456 A1 Apr. 18, 2002

(30) Foreign Application Priority Data
Aug. 22, 2000 (FR) .............................. 0010804

(51) Int. Cl.[7] ................................ F21V 7/04
(52) U.S. Cl. .................. 362/555; 362/558; 362/544; 362/581; 362/240; 362/800; 362/455; 362/255
(58) Field of Search ................... 362/555, 558, 362/544, 581, 240, 800, 455, 255, 235, 257, 241, 244, 245, 246, 247, 374

(56) References Cited

U.S. PATENT DOCUMENTS

| 4,829,407 A | 5/1989 | Bushell et al. ................. 362/29 |
| 5,335,151 A | 8/1994 | Dahlberg ................... 362/153.1 |
| 6,076,950 A | * 6/2000 | Topping et al. ............. 362/245 |

FOREIGN PATENT DOCUMENTS

| FR | 0596782 A1 | 5/1994 | ............ B60Q/1/26 |
| WO | WO 98/33007 | 7/1998 | ............ F21S/1/10 |

* cited by examiner

Primary Examiner—Sandra O'Shea
Assistant Examiner—Bertrand Zeade
(74) Attorney, Agent, or Firm—Frank Keegan

(57) ABSTRACT

The invention relates to a luminaire comprising a housing (1) which defines an internal space containing at least one light source formed by a light-emitting diode (LED) (2) and optical means (4) for guiding the light emitted by the LED (2) to the exterior of the housing (1). The LED (2) is mounted to a support (3) connected to the housing (1), and the optical means (4) are held between a retaining element (10) connected to the housing (1) and the support (3) of the LED (2).

14 Claims, 3 Drawing Sheets

LUMINAIRE BASED ON THE LIGHT EMISSION OF LIGHT-EMITTING DIODES

The invention relates to a luminaire comprising a housing which defines an internal space containing at least one light source formed by a light-emitting diode (LED) and optical means for guiding the light emitted by the LED to the exterior of the housing.

Such a luminaire is known from the document WO 98/33007. This luminaire, designed for street lighting, utilizes light emitted by LEDs: the optical guiding means used ensure on the one hand a concentration of the luminous intensity produced by the LED into a beam and on the other hand a defined direction of the beam.

The emission characteristic of a LED has a special shape. The optical means, which operate by principles of physical optics, have a geometry which renders it possible to obtain an optimum performance, provided the optical means occupy an accurate and constant position with respect to the emission characteristic of the LED. Since the luminaire is to be first transported and then installed, the robustness of the mounting of the optical means with respect to the LED must be guaranteed if the luminaires are to maintain the properties claimed by the manufacturer.

In the document WO 98/33007, the LED is fixed inside the optical means, which in their turn are fixed to the housing. The realization of this construction necessitates delicate manipulations of the LED. The LEDs, however, are highly sensitive to mechanical manipulations: their operational life and their light-emission performance depend on the care with which they are handled, especially during their mounting inside a luminaire as described in the opening paragraph. The LED comprises, among other things, a fragile dome on which no major forces are allowed to be exerted. A delicate mounting operation such as the one proposed in the document WO 98/33007 is accordingly to be avoided. In addition, this mounting is time-consuming and costly in terms of automated operations.

It is an object of the invention to resolve to a high extent the problem of mounting the optical means relative to the LED inside the luminaire.

According to the invention, a luminaire as described in the opening paragraph is for this purpose characterized in that the LED is mounted to a support connected to the housing, and in that the optical means are held between a retaining element connected to the housing and the support of the LED.

The mounting thus realized involves a placement of the optical means on the support of the LED and the use of the retaining element connected to the housing for keeping it fixed. This mounting provides the advantages that no delicate manipulations of the LED are necessary because the latter may be pre-installed on its support, that it is fast, and that it can be readily automated.

In an embodiment of the invention, the optical means are elastically held between the retaining element connected to the housing and the support of the LED by elastic retention means. Said elastic retention means in cooperation with the retaining element connected to the housing then exert a pressure on the optical means. As a result, the optical means exert a pressure on the support of the LED. Any mechanical play which may exist between the retaining element connected to the housing and the optical means and between the optical means and the support of the LED is eliminated, and this prevents relative movements of the optical means with respect to the support of the LED. The shapes of the optical means and those of the support of the LED are advantageously adapted such that, under pressure, the contact between the optical means and the support of the LED will serve to guarantee a precise and constant position which causes the assembly to provide an optimum performance.

In a preferred embodiment of the invention, the elastic retention means of the optical means are realized in the form of a block of elastic material placed in a position such that it is compressed between the retaining element connected to the housing and the optical means. Said elastic material may in particular be one of any number of foam types. This solution has the advantages that it is simple in its implementation and that it renders it possible to control the intensity of the pressure exerted by the optical means on the support of the LED through the choice of the characteristics of the elastic material used.

In an advantageous embodiment of the invention, a material having a low adhesion coefficient is placed between the optical means and the retaining element connected to the housing. This material achieves the contact between the optical means and either the retaining element of the optical means or the elastic retention means. The effect of this material of low adhesion coefficient, which may be polyethylene, is to facilitate relative translatory movements at the level of contact between the optical means and either the retaining element connected to the housing or the elastic retention means. Translatory movements of the retaining element connected to the housing or of the elastic retention means with respect to the housing on which the support of the LED is fixed may in fact carry the optical means along with them, which optical means in that case will be shifted from their position of optimum performance in relation to the emission characteristic of the LED. Said translatory movements resulting in shifts at the level of contact between objects may be the result of an external mechanical stress such as that caused by differences in thermal expansion between different materials. The differences in expansion are indeed the source of relative movements between certain objects in this environment, in which said objects made from different materials are present and in which the temperature is made to vary considerably, which movements may not be negligible.

In an advantageous embodiment of the invention, the retaining element connected to the housing is connected to the housing by gluing means. This solution avoids the necessity of using screws. Screws are habitually used in the field of luminaires, but they cause problems in relation to differences in expansion when the materials joined together are different, which is generally the case with a luminaire as described in the opening paragraph. An additional advantage is that a greater miniaturization of the luminaire is rendered possible than can be achieved with screws, because the use of gluing means requires a certain surface area but does not occupy a substantial volume of material.

In a special embodiment of the invention, the gluing means are formed by adhesive tapes.

In a particularly advantageous embodiment of the invention, the retaining element connected to the housing is a plate which transmits light. This arrangement is advantageously chosen when the light-transmitting plate is laid over the optical means, because in that case it fulfills two functions: it protects the optical means, which are usually fragile, and it keeps said optical means in place.

The invention will be better understood from the following description of a number of embodiments, given by way of example, with reference to the annexed drawings in which:

FIG. 1 shows part of a luminaire in an advantageous embodiment of the invention. This Figure indicates only one embodiment.

Figure 1:
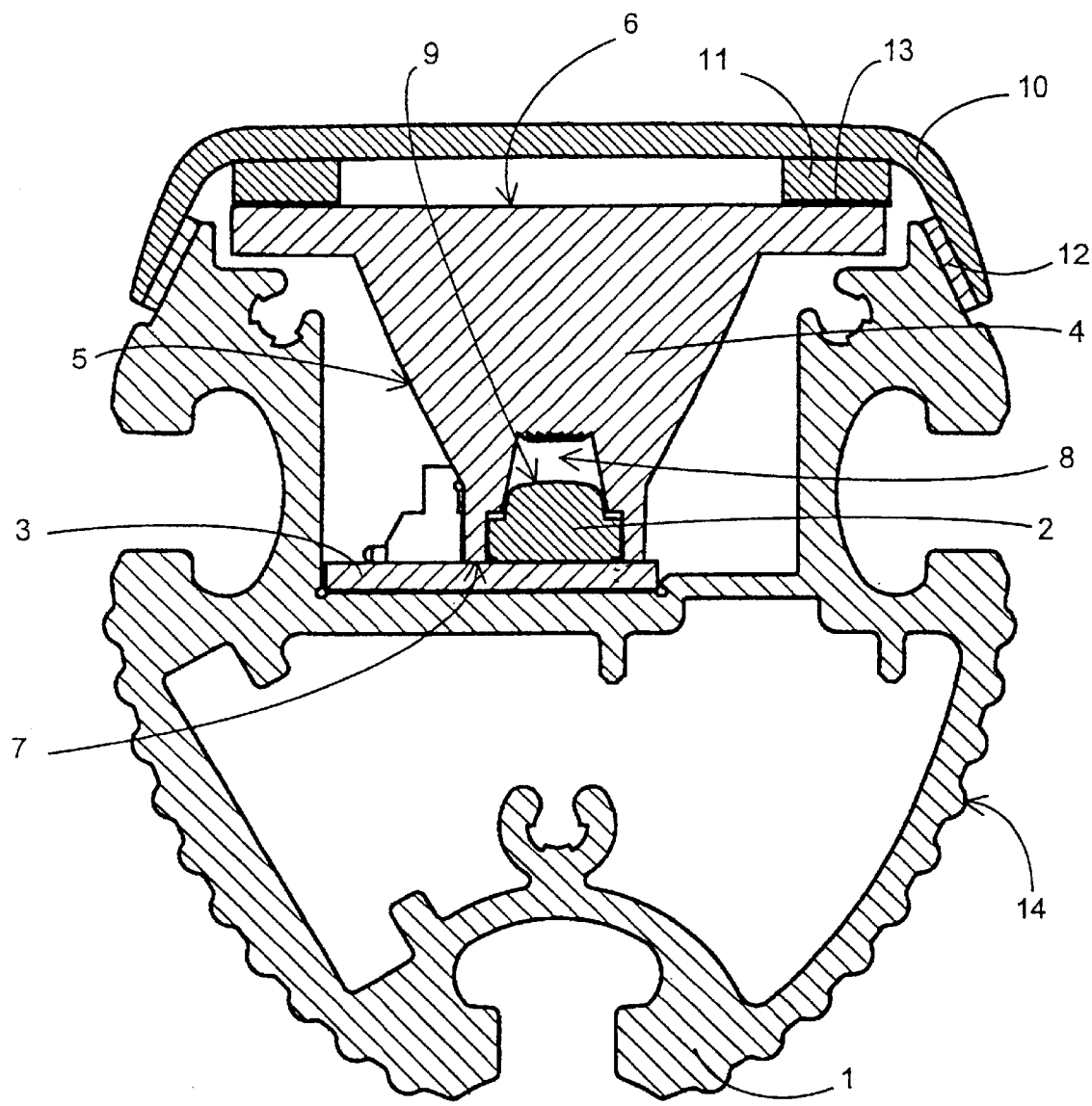
FIG. 1 is a cross-sectional view of an example of a luminaire according to the invention.

This luminaire comprises a housing 1 containing a light source formed by a light-emitting diode or LED 2 mounted on a support 3 which is fixed to the housing 1. The support 3 of the LED may be, for example, a printed circuit board, and the fixation of said support 3 may be realized, for example, by gluing means. The use of the gluing means, for example an adhesive tape, has the advantage that it takes part in a correct removal of heat. The gluing means in fact have good heat conduction properties and permit of a maximum contact surface area between the support 3 and the housing 1. In the embodiment described here, the support 3 is planar, but this does not exclude other geometries of the support 3.

The optical means here comprise a collimator 4 formed by a solid mass of a material which transmits light and is temperature-resistant, for example polymethylmethacrylate (PMMA). The optical means are formed by a "full-body" collimator 4 here, but they may alternatively be formed by, for example, a conical concave reflector. The collimator 4 has a symmetrical lateral surface 5 based on a parabolic or conical body of revolution, a planar front surface 6 here, and a base surface 7 geometrically opposed to the front surface 6. The base 7 is planar here, but this characteristic does not exclude other geometries. The lateral surface 5 of the collimator 4 causes the light emitted by the LED 2 to be concentrated into a beam. The beam obtained here is a directional light beam consisting of parallel rays. This light beam leaves the collimator 4 by the front surface 6 and the direction of said beam is perpendicular to the plane defined by this front surface 6. The emission characteristic of the system comprising the LED 2 and the collimator 4 thus has a maximum emission direction which in this example is perpendicular to the plane defined by the front surface 6 of the collimator 4.

The collimator 4 in addition comprises a cavity 8 in its base 7, provided for accommodating the LED 2. The collimator 4 is placed over the LED 2. Since the LED is sensitive to pressures which may be exerted on its dome 9, the contacts which may arise between the LED 2 and the collimator 4 are minimized in that the inside of the cavity 8 is overdimensioned and the collimator 4 rests with its base 7 on the support 3 on which the LED 2 is mounted.

The optimum luminous performance of the collimator 4, i.e. the control of the structure of the beam and its power, is obtained by means of a precise positioning of the collimator 4 with respect to the emission characteristic of the LED 2. A lateral shift through translation of the base 7 of the collimator 4 with respect to the LED 2 by more than 4% of the diameter of the LED leads to a loss in efficiency of more than 10% here. The tolerances on the dimensions of the base 7 of the collimator 4 and on the dimensions of the cavity 8 are accordingly calculated here such that the lateral translations of the collimator 4 with respect to the LED 2 remain sufficiently small for guaranteeing a good luminous performance at the output of the collimator 4. These dimensions also take into account the necessity of not applying major lateral stresses to the LED 2.

The placement of the collimator 4 on the support 3 of the LED 2 renders it possible to ensure an initial positioning which will be maintained by the retaining element connected to the housing 1. This retaining element in the present embodiment is a plate 10 which transmits light: the light-transmitting plate 10 is thus placed over the collimator 4 while compressing a block of elastic material 11. The plate 10 is connected to the housing 1 by means of a two-sided adhesive tape 12. The collimator 4, being a fragile optical instrument, is thus protected by the light-transmitting plate 10 from external adverse influences which may damage it or impair its optical performance. The use of gluing means, such as the adhesive tape 12, also has the advantage of promoting the sealing of the luminaire. Given the fact that in principle the housing 1 and the plate 10 are made from different materials and are accordingly subject to differences in expansion, the use of gluing means, such as the adhesive tape 12 whose shear resistance properties may be judiciously chosen, also provides a solution for allowing relative movements of the housing 1 and the plate 10.

In this example, the block of elastic material 11 is placed on the front surface 6 of the collimator 4. The elastic material may be chosen from any number of foam materials of different densities and different shapes as a function of the intensity of the pressure which one wishes to exert on the collimator 4 for keeping the latter in place. In an embodiment, for example, the block of elastic material 11 was formed from single-sided adhesive vinyl foam with a density of 225 kg/m$^3$, a thickness of 6 mm, and a width of 3 mm. Numerous modifications of the invention are possible as regards the elastic retention of the optical means as well as the positioning of the elastic retention means relative to other elements of the luminaire: for example, the use of springs is conceivable; and the placement of the elastic retention means between the support of the LED and a surface forming part of the housing itself, which would then constitute the retaining element connected to the housing, is another possible solution according to the invention.

The collimator 4 is here constructed such that it offers an optimum efficiency when the contact of the collimator 4 to the support 3 of the LED 2 is planar. A rotary movement about a family of axes perpendicular to the direction of maximum emission of the emission characteristic of the system comprising the LED 2 and the collimator 4 will result in a breaking of the planar contact between the collimator 4 and the support 3 of the LED 2. In the case described here, a rotation of the collimator of more than 3° about one of these axes will lead to a loss of 10% of the maximum intensity. These rotary movements can only arise if there is a play in a direction close to the direction of maximum emission of the system comprising the LED 2 and the collimator 4, between the various elements thereof such as the support 3 of the LED, the collimator 4, and the plate 10 which transmits the light. The elastic material 11, i.e. the elastic retention means, exerts a pressure on the collimator 4, whereby the planar contact thereof to the support 3 of the LED is enforced. It is achieved in this manner that the elastic retention means of the collimator prevent the presence of said play, whereby said rotations are prevented.

A strip 13 of polyethylene, a material of low adhesion coefficient, is inserted between the elastic retention means formed by the block of elastic material 11 and the optical means formed by the collimator 4, allowing translatory movements caused by differences in expansion between the various elements made from different materials. In particular, the pressure exerted on the collimator 4 by the block of elastic material 11 could impede said translatory movements if said material of low adhesion coefficient were absent and could thus generate a displacement of the collimator along with the light-transmitting plate 10 connected to the housing. The presence of the strip 13 of polyethylene, i.e. a material of low adhesion coefficient, disengages the translatory movements of the elastic material 11 from the collimator 4 and thus avoids movements of the collimator 4 relative to the support 3 of the LED 2.

The housing is advantageously constructed from a heat-conducting material, for example anodized aluminum, and its outer surface comprises an undulating surface 14. The LED 2 emits heat during its operation. If an optimum performance of a LED mainly in terms of its luminous flux is to be obtained, a controlled temperature is necessary: the heat generated by the LED 2 must accordingly be removed. The heat-conducting material of the housing renders it possible to remove the heat to the exterior, and the undulating surface enhances the efficacy of this radiator effect.

Figure 2:
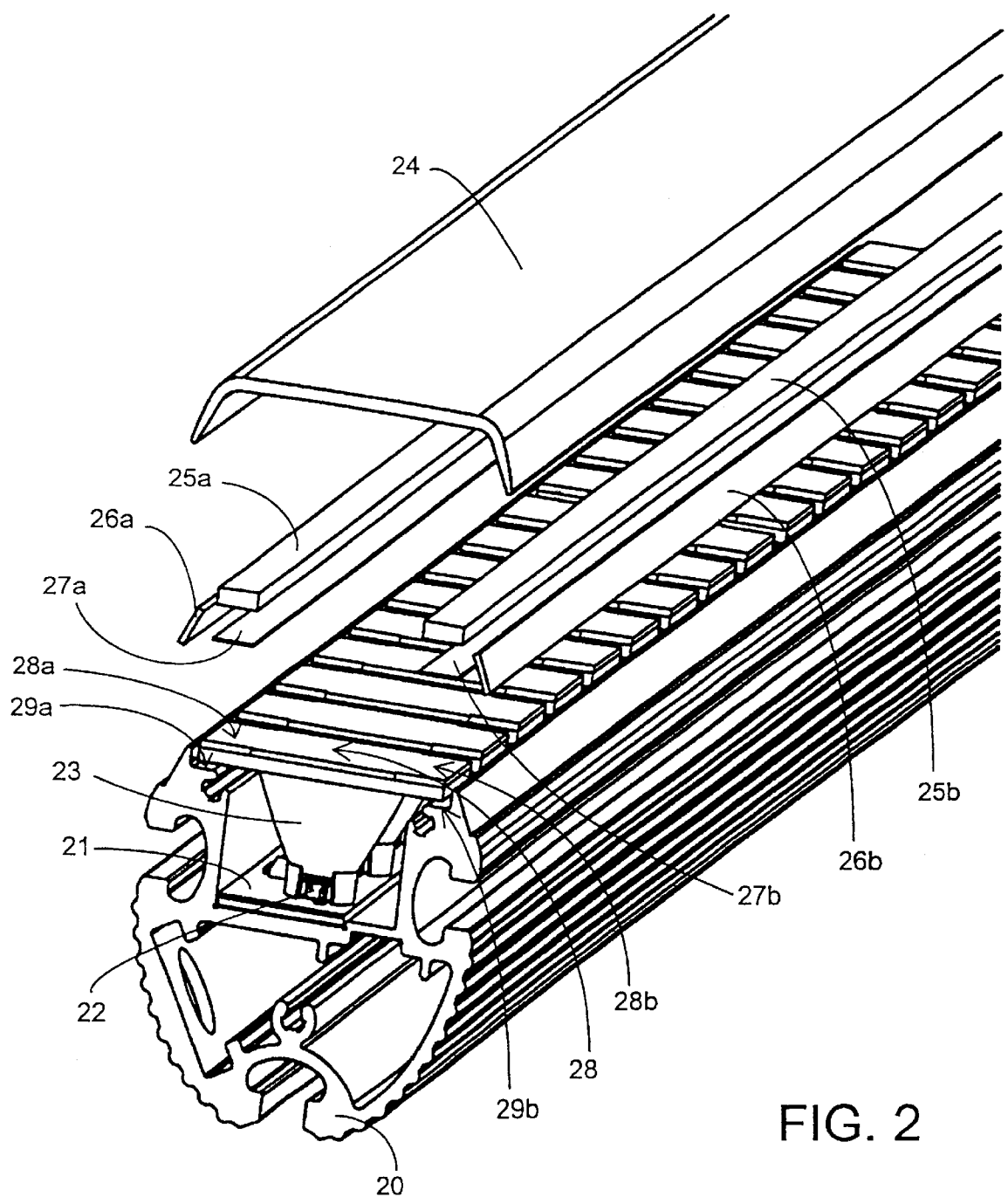
FIG. 2 is an exploded perspective view of another example of a luminaire in which the invention is implemented.

FIG. 2 depicts an embodiment of the invention inside a luminaire comprising a plurality of LEDs whose optical means are fixed in accordance with the invention. The increase in the number of LEDs leads to an increase in the length of the luminaire, and as a result thereof the movements caused by differences in expansion between different materials are greater. The invention finds a particularly interesting application in this case.

A support 21 carrying a number of LEDs 22 is fixed in a housing 20. A collimator 23 is aligned and placed on the support 21 of each of the LEDs 22. In a particular embodiment of the invention, several collimators 23 may alternatively be provided in a single component placed on the support 21 such that each collimator is centered on one LED 22. A light-transmitting plate 24 is placed on top of the set of collimators 23, compressing two strips 25a and 25b of elastic material. The plate 24 is connected to the housing 20 by means of two strips 26a and 26b of two-sided adhesive tape. Two strips 27a and 27b of polyethylene, i.e. a material with a low adhesion coefficient, are inserted between the collimators 23 and the strips 25a and 25b of elastic material, thus permitting translatory movements caused by differences in expansion between the various elements, such as the plate 24 and the housing 20, which are made from different materials.

In this example, the use of several assemblies formed by a LED and its optical means requires that these assemblies formed by a LED and its optical means have a homogeneous lumen output. Differences in lumen output between individual assemblies will detract from the aesthetic effect and/or the efficacy of the overall performance. A fixation of the optical means in the optimum position with respect to the emission characteristic of the LEDs is indeed of particular importance for safeguarding the homogeneity of the light output of each of the assemblies formed by a LED and its optical means. By safeguarding an optimum, individual positioning of the optical means with respect to the emission characteristic of each of the LEDs the invention clears the way for uniform lighting arrangements of various shapes based on the emission of a plurality of LEDs.

In the present example, the collimators 23 have a rectangular, widened front surface 28 which exceeds the actual output surface of the light beam. This widened front surface 28 serves as a support surface for the two strips 25a and 25b of elastic material which are placed on the edges 28a and 28b of the front surface 28 such that they do not reduce the luminous flux.

Since the front surface 28 is rectangular, the collimators have no rotational symmetry. It might be desirable for aesthetic reasons to prevent a rotation about an axis perpendicular to the plane defined by the front surface 28 of the collimators 23. This rotation is even more unpleasant if the optical means have no rotational symmetry for the purpose of providing an output beam which also has no rotational symmetry: said rotation would accordingly affect the photometric properties of the luminaire. This rotation may be limited by shoulders 29a and 29b provided on the housing 20. In the embodiment shown in FIG. 2, however, it is difficult to control the play present between the collimators 23 and the shoulders 29a and 29b in the housing 20, which is made of extruded aluminum here, in view of industrial processes used for the manufacture of this housing. Said rotation is accordingly only roughly limited.

Figure 3:
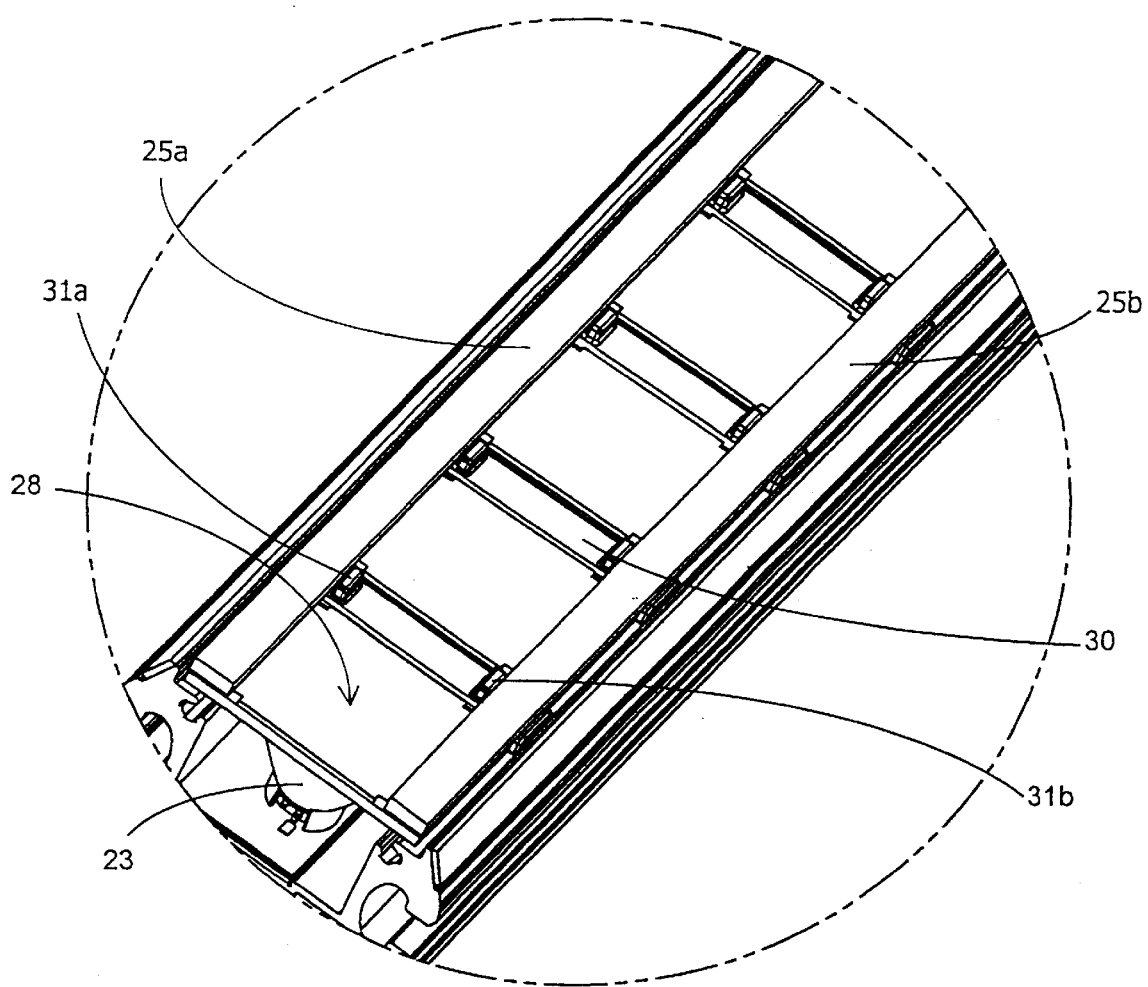
FIG. 3 is a bird's eye view of an improved embodiment of the luminaire of FIG. 2.

FIG. 3 shows part of an improved embodiment of the luminaire of FIG. 2 viewed from below, with components similar to those of FIG. 2 being given the same reference numerals. The improvement consists in a limitation of the extent of the rotary movement of the collimators 23 with respect to an axis perpendicular to the plane defined by the front surface 28 of the collimator 23. Rigid pieces 30 are for this purpose inserted between the individual front surfaces 28 of the collimators 23. These rigid pieces 30 have dimensions calculated such that there is a clearance between said rigid pieces 30 and the collimators 23. The presence of said rigid pieces in fact renders it possible to limit the extent of the rotation of the collimators 23 without making the assembly of the collimators 23 rigid, the latter having to remain individually independent so as not to generate stresses on the LEDs 22. In this example, the best adapted shape of these rigid pieces 30 is a parallelepiped shape which fills up the empty space present between two front surfaces 28 of two collimators 23, but this shape is not exclusive and may be varied in many ways so as to adapt to the geometry of the luminaire and/or that of the optical means. Said rigid pieces 30 may be used in combination with the invention or independently of the invention.

Two projections 31a and 31b are advantageously situated on each of the rigid pieces 30 to serve as abutments for the strips 25a and 25b of elastic material and for the strips 26a and 26b of polyethylene shown in FIG. 2. This prevents these elements from covering that portion of the front surface 28 of the collimator 23 through which the light beam is to issue to the exterior. Said projections 31a and 31b could be realized on the front surface 28 of the collimator 23 in an alternative embodiment.

Figure 4:
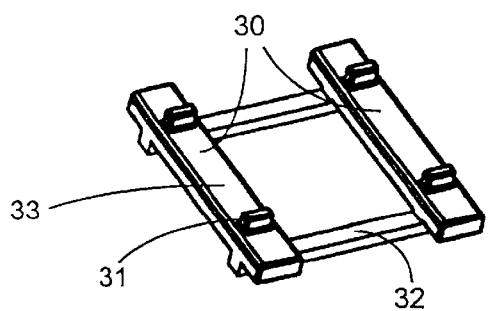
FIG. 4 is a perspective view of an adjustment piece for mechanical play used in a special embodiment of the invention of the types shown in FIGS. 2 and 3.

FIG. 4 shows a particular example of an embodiment of the rigid piece 30. Said rigid pieces 30 of parallelepiped shape and inserted between the individual front surfaces 28 of the collimators 23 are here grouped together, for example two-by-two, into a single play adjustment piece 33 each time by means of a connection element 32 which forms a whole with the two parallelepiped-shaped rigid pieces 30. Said play adjustment piece 33 may be realized, for example, through molding/casting of any kind of rigid material. Molding and casting are particularly favorable because the projections 31 can be easily realized thereby.

The particular shape of this example of a play adjustment piece 33 renders it possible to limit the movements of the rigid pieces 30 between the collimators 23 which could arise in the case of independent rigid pieces 30.

What is claimed is:

1. A luminaire comprising a housing which defines an internal space containing at least one light source formed by a light-emitting diode (LED) and optical means for guiding the light emitted by the LED towards outside of the housing, characterized in that the LED is mounted to a support connected to the housing, and the optical means is held between a retaining element connected to the housing and the support for the LED by pressure exerted by the retaining element and the support for the LED, wherein the optical means has first and second ends, the first end being proximate the support connected to the housing and the second end being proximate the retaining element.

2. A luminaire as claimed in claim 1, characterized in that a material having a low adhesion coefficient is placed between the second end of the optical means and the retaining element connected to the housing.

3. A luminaire as claimed in claim 1, characterized in that the retaining element connected to the housing is connected to the housing by gluing means.

4. A luminaire as claimed in claim 3, characterized in that the gluing means are formed by adhesive tapes.

5. A luminaire as claimed in claim 1, characterized in that the retaining element connected to the housing is a plate which transmits light.

6. A luminaire as claimed in claim 1, characterized in that the first end of the optical means is in contact with the support connected to the housing.

7. A luminaire as claimed in claim 6 characterized in that there is elastic retention means between the second end of the optical means and the retaining element.

8. A luminaire as claimed in claim 7 characterized in that the elastic retention means are realized in the form of a block of elastic material placed in a position such that it is compressed between the retaining element connected to the housing and the second end of the optical means.

9. A luminaire as claimed in claim 7, characterized in that both the support connected to the housing and the first end of the optical means are planar.

10. A luminaire as claimed 9, wherein the optical means is a solid light conductor having a cavity for accommodating the LED.

11. A luminaire as claimed in claim 1 wherein the internal space includes a plurality of LED's and wherein the optical means comprises a plurality of light conductors, each being associated with a different LED, said luminaire further including a plurality of rigid members intermediate adjacent light conductors for limiting the range of rotation of said light conductors.

12. A luminaire as claimed in claim 11 wherein each rigid member has two projections thereon which aid in positioning said members.

13. A luminaire comprising a housing which defines an internal space containing at least one light source formed by a light-emitting diode (LED) and optical means for guiding the light emitted by the LED towards outside of the housing wherein the LED is mounted to a planar support connected to the housing and the optical means is held between a plate which transmits light which comprises a retaining element connected to the housing and the support for the LED by pressure exerted by the retaining element and the support, wherein the optical means has first and second ends, the first end being planar and being in direct contact against the planar support, the second end being proximate the retaining element, there being elastic retention means between the second end and the retaining element, and the optical means comprising a light conductor having a cavity near said first end for accommodating the LED.

14. A luminaire comprising a housing which defines an internal space containing at least one light source formed by a light-emitting diode (LED) and optical means for guiding the light emitted by the LED towards outside of the housing characterized in that the LED is mounted to a support connected to the housing, and the optical means are elastically held between a retaining element connected to the housing and the support for the LED by elastic retention means which comprises a block of elastic material placed in a position such that it is compressed between the retaining element and the optical means.

* * * * *